US009354257B2

(12) United States Patent
Williams

(10) Patent No.: US 9,354,257 B2
(45) Date of Patent: May 31, 2016

(54) SYSTEMS AND METHODS FOR USE IN MEASURING CURRENT THROUGH A CONDUCTOR

(75) Inventor: Craig Benjamin Williams, Louisville, KY (US)

(73) Assignee: General Electric Company, Schenectady, NY (US)

(*) Notice: Subject to any disclaimer, the term of this patent is extended or adjusted under 35 U.S.C. 154(b) by 1069 days.

(21) Appl. No.: 13/289,988

(22) Filed: Nov. 4, 2011

(65) Prior Publication Data
US 2013/0116955 A1 May 9, 2013

(51) Int. Cl.
*G06F 19/00* (2011.01)
*G01R 15/20* (2006.01)

(52) U.S. Cl.
CPC ...................... *G01R 15/20* (2013.01)

(58) Field of Classification Search
CPC ........................................ G01R 15/20
USPC .............. 324/117 H, 117 R, 142, 424, 324/762.01–762.1
See application file for complete search history.

(56) References Cited

U.S. PATENT DOCUMENTS

| 5,721,485 | A | 2/1998 | Hsu et al. | |
| 5,721,489 | A * | 2/1998 | Weaver et al. | 324/329 |
| 6,454,169 | B1 | 9/2002 | Belknap et al. | |
| 6,651,889 | B2 | 11/2003 | Belknap et al. | |
| 6,731,105 | B1 * | 5/2004 | Hoyle et al. | 324/117 R |
| 6,798,193 | B2 | 9/2004 | Zimmerman et al. | |
| 6,836,386 | B2 | 12/2004 | Koski | |
| 6,879,145 | B1 | 4/2005 | Harris | |
| 6,917,193 | B1 * | 7/2005 | Howard et al. | 324/117 H |
| 7,042,208 | B1 | 5/2006 | Harris | |
| 7,116,100 | B1 | 10/2006 | Mock et al. | |
| 7,164,263 | B2 | 1/2007 | Yakymyshyn et al. | |
| 7,177,779 | B2 | 2/2007 | Hikida et al. | |

(Continued)

FOREIGN PATENT DOCUMENTS

| AT | 493671 T | 1/2011 |
| AU | 2003258260 A1 | 3/2004 |

(Continued)

OTHER PUBLICATIONS

Gilbert et al., "Linear Hall-Effect Sensor ICS," Applications Information, Allegro MicroSystems, Inc., Worcester, Massachusetts, 2002 (9 pgs).

(Continued)

*Primary Examiner* — Arleen M Vazquez
*Assistant Examiner* — Robert P Alejnikov, Jr.
(74) *Attorney, Agent, or Firm* — General Electric Company

(57) ABSTRACT

Systems, methods and devices for use in measuring current through a conductor are provided. One example current device includes a first sensor configured to measure a first magnetic flux provided from a conductor and to generate a first signal proportional to the first magnetic flux, and a second sensor configured to measure a second magnetic flux provided from the conductor and to generate a second signal proportional to the second magnetic flux. The second sensor is spaced apart from the first sensor by a predetermined distance. The current device further includes a processor configured to determine, based on the first signal, the second signal and the predetermined distance, a radius between the conductor and at least one of the first sensor and the second sensor.

13 Claims, 3 Drawing Sheets

(56) References Cited

U.S. PATENT DOCUMENTS

| | | |
|---|---|---|
| 7,259,551 B2 | 8/2007 | Mock et al. |
| 7,274,186 B2 | 9/2007 | Yakymyshyn et al. |
| 7,279,884 B2 | 10/2007 | Yakymyshyn et al. |
| 7,279,885 B2 | 10/2007 | Yakymyshyn et al. |
| 7,321,226 B2 | 1/2008 | Yakymyshyn et al. |
| 7,378,837 B2 | 5/2008 | Andarawis et al. |
| 7,508,200 B2 | 3/2009 | Kahlman et al. |
| 7,746,065 B2 | 6/2010 | Pastre et al. |
| 2004/0032251 A1 | 2/2004 | Zimmerman et al. |
| 2005/0156587 A1 | 7/2005 | Yakymyshyn et al. |
| 2005/0286190 A1* | 12/2005 | Rostron et al. ............... 361/65 |
| 2006/0208726 A1 | 9/2006 | Mock et al. |
| 2007/0001668 A1 | 1/2007 | Mock et al. |
| 2007/0057662 A1 | 3/2007 | Yakymyshyn et al. |
| 2007/0063690 A1* | 3/2007 | De Wilde et al. ......... 324/117 R |
| 2007/0063691 A1 | 3/2007 | Yakymyshyn et al. |
| 2007/0120553 A1 | 5/2007 | Andarawis et al. |
| 2007/0205749 A1 | 9/2007 | Yakymyshyn et al. |
| 2007/0205750 A1 | 9/2007 | Yakymyshyn et al. |
| 2007/0247141 A1 | 10/2007 | Pastre et al. |
| 2008/0036450 A1 | 2/2008 | Kahlman et al. |
| 2008/0129286 A1 | 6/2008 | Kahlman et al. |
| 2009/0224755 A1 | 9/2009 | Kahlman et al. |
| 2009/0230955 A1* | 9/2009 | Kejik et al. ................ 324/253 |
| 2009/0284250 A1 | 11/2009 | Rittmann |
| 2011/0031960 A1 | 2/2011 | Hohe et al. |
| 2011/0169488 A1 | 7/2011 | Mather |

FOREIGN PATENT DOCUMENTS

| | | |
|---|---|---|
| CA | 2698141 A1 | 3/2009 |
| CN | 101023367 A | 8/2007 |
| CN | 101065660 A | 10/2007 |
| CN | 101065661 A | 10/2007 |
| CN | 101069094 A | 11/2007 |
| CN | 101147044 A | 3/2008 |
| CN | 101216539 A | 7/2008 |
| CN | 100559129 C | 11/2009 |
| CN | 102004179 A | 4/2011 |
| DE | 102007041230 B3 | 4/2009 |
| EP | 1546748 A1 | 6/2005 |
| EP | 1637898 A1 | 2/2006 |
| EP | 1789813 A1 | 5/2007 |
| EP | 1820009 A2 | 8/2007 |
| EP | 1820010 A2 | 8/2007 |
| EP | 1820011 A2 | 8/2007 |
| EP | 1864087 A1 | 12/2007 |
| EP | 1942348 A1 | 7/2008 |
| EP | 2174153 A1 | 4/2010 |
| JP | 2008513762 A | 5/2008 |
| JP | 2008522149 A | 6/2008 |
| JP | 2008522150 A | 6/2008 |
| JP | 2008522151 A | 6/2008 |
| JP | 2008164611 A | 7/2008 |
| JP | 2008533497 A | 8/2008 |
| JP | 2010537207 A | 12/2010 |
| KR | 20080064084 A | 7/2008 |
| MX | 2007015879 A | 2/2009 |
| WO | 2004017084 A1 | 2/2004 |
| WO | 2006056829 A1 | 6/2006 |
| WO | 2006059268 A2 | 6/2006 |
| WO | 2006059270 A2 | 6/2006 |
| WO | 2006067646 A2 | 6/2006 |
| WO | 2006101674 A1 | 9/2006 |
| WO | 2009030361 A1 | 3/2009 |

OTHER PUBLICATIONS

"Continuous-Time Ratiometric Linear Hall Effect Sensor ICs", A1301 and A1302, Allegro MicroSystems, Inc., Worcester, Massachusetts, 2005, www.allegromicro.com, (10 pgs).

"Ratiometric Linear Hall Effect Sensor ICs for High-Temperature Operation," A1321, A1322, and A1323, Allegro MicroSystems, Inc., Worcester, Massachusetts, 2004, www.allegromicro.com, (13 pgs).

Salmasi, F.R., "Virtual off-line auto calibrating position and current sensors for switch-reluctance-motor drives," Electric Power Applications, IEEE Proceedings on Jul. 2006, vol. 153, issue 4, pp. 551-558.

* cited by examiner

SYSTEMS AND METHODS FOR USE IN MEASURING CURRENT THROUGH A CONDUCTOR

BACKGROUND OF THE INVENTION

The subject matter disclosed herein relates generally to current measuring systems and methods and, more specifically, to current measuring systems including multiple sensors.

Circuit breakers currently used to protect, for example, a residential or commercial environment, generally detect the presence of over-current conditions and control an operating mechanism to separate contacts of the circuit breaker. Various types of sensors are known for monitoring a current through the circuit breaker.

For example, current may be monitored by positioning a shunt resistor in the current path and measuring a voltage drop across the shunt resistor. Heat generated by the shunt resistor, as well as noise associated with the shunt resistor, often provide additional considerations when monitoring current in this manner. In another example, a sense transformer is used to detect a level of alternating current (AC) within a conductor without positioning a shunt resistor in the current path. In still another example, solid state magnetic field sensors are used to measure AC or direct current (DC) flowing through a conductor without positioning a shunt resistor in the current path. The magnetic field sensors measure a magnetic flux and output a voltage that corresponds to a level of magnetic flux measured. Accordingly, such sensors are susceptible to error if the relative position of the sensor and the conductor is altered, without further calibration.

BRIEF DESCRIPTION OF THE INVENTION

In one aspect, a sensor assembly for use in measuring current through a conductor is provided. The current device includes a first sensor configured to measure a first magnetic flux provided from a conductor and to generate a first signal proportional to the first magnetic flux, and a second sensor configured to measure a second magnetic flux provided from the conductor and to generate a second signal proportional to the second magnetic flux. The second sensor is spaced from the first sensor by a first predetermined distance. The current device further includes a processor coupled to the first sensor and to the second sensor. The processor is configured to determine, based on the first signal, the second signal, and the first predetermined distance, a radius between the conductor and at least one of the first sensor and the second sensor.

In another aspect, a circuit breaker for use in protecting a load from an over-current condition is provided. The circuit breaker includes a conductor configured to conduct a current from a power source to a load, a first magnetic field sensor configured to generate a first signal proportional to a first magnetic flux from the conductor, a second magnetic field sensor configured to generate a second signal proportional to a second magnetic flux from the conductor, and a plurality of contacts coupled to the conductor. The second sensor is spaced apart from the first sensor by a first predetermined distance. The plurality of contacts defines an open position to block current flow from the power source to the load and a closed position to permit current flow from the power source to the load. The circuit breaker further includes a processor configured to detect an over-current condition, based on the first signal, the second signal, and the first predetermined distance, and to actuate the plurality of contacts to the open position in response to the over-current condition.

In yet another aspect, a method for use in measuring current through a conductor is provided. The method includes receiving a first signal from a first sensor indicative of a first magnetic flux provided from a conductor, receiving a second signal from a second sensor indicative of a second magnetic flux provided from the conductor, and determining a radius between the conductor and the first sensor based on the first signal, the second signal, and a predetermined distance between the first sensor and the second sensor.

DETAILED DESCRIPTION OF THE INVENTION

The systems and methods described herein measure current through a conductor and, for example, use the measured current to operate a circuit protection device. Although described herein with respect to circuit protection devices, the systems, methods, and assemblies described herein may also be included within, or used in conjunction with, different types of devices. For example, different systems may include, without limitation, electric motors, control systems, power distribution systems, and/or electric vehicles.

The systems and methods described herein include a plurality of sensors to measure the magnetic flux of a conductor and a processor configured to determine a radius between at least one of the sensors and the conductor, which may be used by the processor to determine the current through the conductor.

Exemplary technical effects of the methods and systems described herein may include at least one of (a) receiving a first signal from a first sensor indicative of a first magnetic flux provided from a conductor, (b) receiving a second signal from a second sensor indicative of a second magnetic flux provided from the conductor, and (c) determining a radius between the conductor and the first sensor based on the first signal, the second signal, and a predetermined distance between the first sensor and the second sensor.

Figure 1:
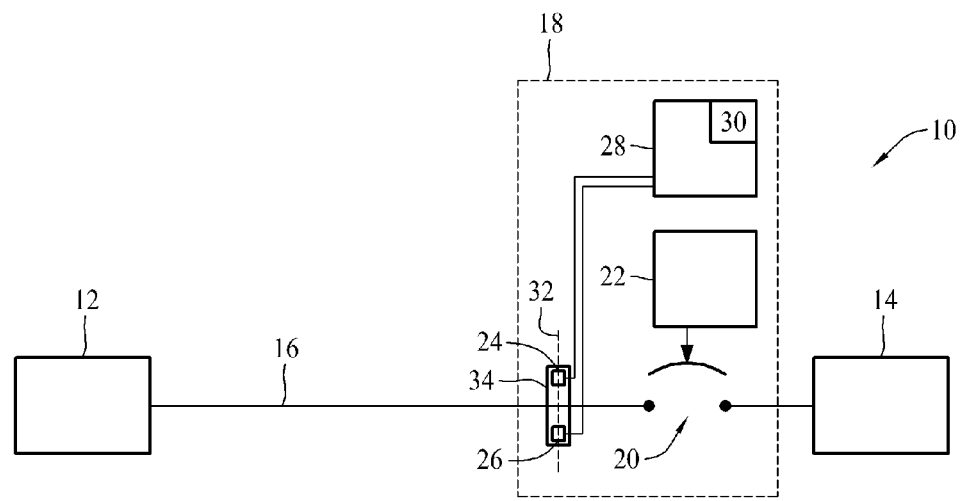
FIG. 1 is a block diagram of an exemplary embodiment of an electrical distribution system.

FIG. 1 illustrates an exemplary electrical distribution system 10. In the exemplary embodiment, electrical distribution system 10 includes a power source 12 and a load 14. Power source 12 is coupled to load 14 through at least one conductor 16 to provide current flow therebetween. Power source 12 may include, without limitation, a power generator, a local electric grid, a wide-area electric grid, and/or other device and/or system suitable to provide current through conductor 16 to load 14. Electric distribution system 10 includes a current device 18 configured to measure current through conductor 16. In the exemplary embodiment, current device 18 is configured to measure direct current (DC) through conductor 16. Current device 18 may, however, be configured otherwise to measure alternating current (AC) through conductor 16 in other embodiments.

Referring to FIG. 1, current device 18 includes a circuit breaker configured to provide over-current protection. As used herein, the term "over-current" refers to a condition in which an actual current exceeds a nominal or expected current. Often, over-current conditions arise when the actual current exceeds the nominal current by some threshold percentage or threshold value. In the exemplary embodiment, current device 18 includes a processor 28, a plurality of contacts 20, and an actuator 22 coupled to contacts 20. Actuator 22 is configured to actuate contacts 20, in response to a control signal from processor 28, between an open position to block current flow from power source 12 to load 14 and a closed position to permit current flow from power source 12 to load 14. The control signal may be provided, for example, in response to a detected over-current condition to actuate contacts 20 to the open position. It should be appreciated that the current device 18 is not limited to a protection device, such as a circuit breaker, but may include several different types of devices suitable to measure and/or respond to current through a conductor.

In the exemplary embodiment, current device 18 includes a first sensor 24 and a second sensor 26. Sensor 24 is spaced from conductor 16 by a radius 42, and sensor 26 is spaced from conductor 16 by radius 44. Sensor 24 is configured to measure a first magnetic flux provided from conductor 16 and to generate a first signal proportional to the first magnetic flux. Sensor 26 is configured to measure a second magnetic flux provided from conductor 16 and to generate a second signal proportional to the second magnetic flux. As should be apparent, because a magnetic field generated by conductor 16 is different depending on the radius of sensors 24 and 26 from conductor 16, the first magnetic flux and the second magnetic flux are dependent on the position and/or orientation of sensors 24 and 26 relative to conductor 16. In the exemplary embodiment, sensors 24 and 26 are magnetic field sensors, and more specifically, Hall effect sensors. It should be appreciated that other types of sensors suitable to perform as described herein may be used in other current measuring system embodiments, such as, for example, anisotropic magnetoresistance (AMR) sensors, fluxgate/micro-fluxgate sensors, giant magnetoresistive (GMI) sensors, giant magnetoresistance (GMR) sensors, magnetostrictive sensors, and/or magnetic tunnel effect (TMR) sensors, etc.

Sensors 24 and 26 are coupled to processor 28, which receives the first and second signals from sensors 24 and 26. Processor 28 may include one or more processing units (e.g., in a multi-core configuration). The term processor, as used herein, refers to one or more of central processing units, microprocessors, microcontrollers, reduced instruction set circuits (RISC), application specific integrated circuits (ASIC), analog circuits, logic circuits, and/or any other circuit or device capable of executing instructions to measure the current through conductor 16 as described herein. In at least one embodiment, processor 24 includes a microcontroller and one or more external circuits. Such external circuits may be used to add an offset, filter (e.g., low pass, high pass, and/or band pass), combine, sum, reduce, and/or otherwise condition one or both of the first signal and second signal, prior to providing one or more signals to the microcontroller. Regardless of the type and/or number of external circuits used in combination with a microcontroller, the term "processor" as used herein in intended to be inclusive of the microcontroller and the external circuits, Furthermore, current device 18 includes a memory 30 coupled to processor 24. Memory 30 includes one or more devices operable to enable information such as executable instructions and/or other data to be stored and/or retrieved. Memory 30 may include one or more computer readable media, such as, without limitation, hard disk storage, optical drive/disk storage, removable disk storage, flash memory, non-volatile memory, ROM, EEPROM, random access memory (RAM), etc. Memory 30 may be configured to store, without limitation, computer-executable instructions, correction factors, and/or any other type of data. While memory 30 is illustrated as incorporated with processor 28, it may be separate in one or more other embodiments.

Processor 28 is configured to determine the current through conductor 16 based on the first signal, the second signal and the predetermined distance. More specifically, in the exemplary embodiment, processor 28 determines a ratio defined by the first signal and the second signal. Processor 28 uses the ratio indicates the portion of the predetermined distance to determine the radius 42 and/or radius 44. Based on the defined radius and the first and second signals, processor 28 is able to accurately determine current through conductor 16. In this manner, the current through conductor 16 is measured by determining the radius during the operation of current device 18. Processor 28 then compares the measured current to a threshold to detect an over-current condition and to provide control signals to actuator 22 to control contacts 20 accordingly.

Under various conditions, such as shipment, testing, installation, and/or operation, conductor 16 may be displaced relative to one or both of sensors 24 and 26, causing radius 42 and radius 44 to change. Known uses of magnetic field sensors rely on the precise position of a conductor relative to the magnetic field sensor. Accordingly, such displacement causes inaccuracies, often requiring further calibration, using a precise current source and/or a precise current measuring device. In contrast, systems and methods described herein determine the radius between conductor 16 and sensors 24 and 26 during operation, such that displacement of conductor 16 does not substantially affect the accuracy of current device 18. As such, precise control of the radius and/or numerous calibrations associated with known uses of magnetic field sensors may be omitted.

Sensors 24 and 26 may be supported in a variety of ways and/or orientations relative to one another and relative to conductor 16. In the exemplary embodiment, sensors 24 and 26 are coupled to a rigid substrate 34, such as a circuit board. Accordingly, sensors 24 and 26 are spaced apart by a predetermined distance, which is substantially fixed, because displacement of substrate 34 causes each of sensors 24 and 26 to be displaced substantially identically. In this example, the predetermined distance is between about 0.5 inches and about 2.0 inches. In other examples, the predetermined distance may be any other suitable distance, potentially dependent on the types of sensors 24 and 26 and/or an intended installation environment of current device 18.

In the exemplary embodiment, processor 28 is configured to occasionally, determine the radius from at least one of sensors 24 and 26 to conductor 16. As used herein, occasionally includes, without limitation, constantly, periodically, randomly, responsive to a command, responsive to a schedule, and/or responsive to one or more conditions. When processor 28 determines the distance, less than constantly, one or more radiuses are stored in memory 30 and recalled to subsequently determine current through conductor 16. In various embodiments, the interval between determining and storing radiuses in memory 30 may be reduced to provide a more rapid response to relative movement between conductor 16 and one or both of sensors 24 and 26. In at least one embodiment, one or more radiuses may be determined constantly to provide a substantially real-time response to relative movement between conductor 16 and one or both of sensors 24 and 26.

Figure 2:
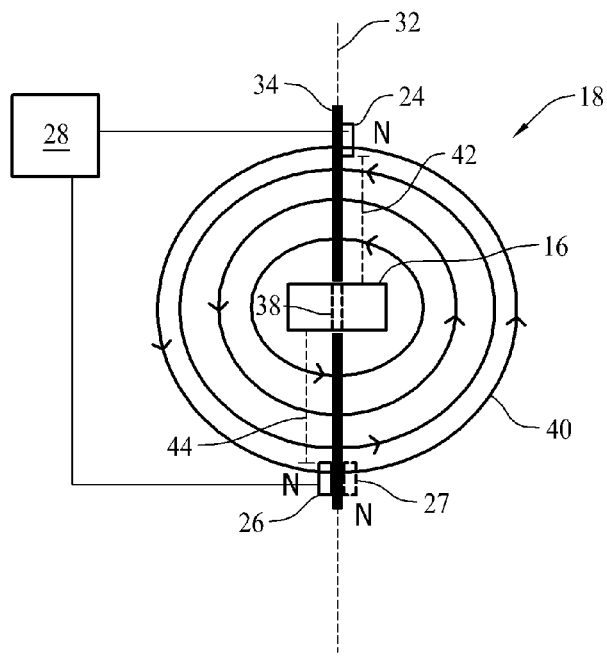
FIG. 2 is a block diagram of an exemplary current device that may be used in the electrical distribution system of FIG. 1.

As shown in FIG. 1, in this exemplary embodiment, sensors 24 and 26 are linearly disposed with conductor 16 along line 32. The relative orientation of sensors 24 and 26 is illustrated in more detail in FIG. 2. As shown, conductor 16 includes a bus bar, which defines an aperture 38. As shown, substrate 34 extends through aperture 38, which forms a friction fit with conductor 16. In this manner, movement of substrate 34 (and sensors 24 and 26) is restricted except in the y-direction, which is aligned with line 32. Accordingly, during shipment, testing, and/or installation, etc., substrate 34 may be displaced along line 32. As explained above, processor 28 is configured to determine the radius between sensors 24 and 26 and conductor 16, thereby substantially eliminating an affect of the displacement of the accuracy of current device 18.

Further, each of sensors 24 and 26 are disposed on opposite sides of substrate 34 and oriented such that the first signal and the second signal have the same polarity and the same amplitude if sensors 24 and 26 are positioned at the same distance from conductor 16. More specifically, conductor 16 generates a magnetic field 40 when current flows through conductor 16. The direction of current flow through conductor 16 dictates the direction of magnetic field 40, as illustrated by the arrows in FIG. 2. Because magnetic field 40 flows into the North Pole (N) of sensor 24 and the north pole (N) of sensor 26, the magnetic flux measured at sensors 24 and 26 have the same polarity. In various embodiments, the orientation and/or the position of sensors 24 and 26 may be altered to provide different first and/or second signals. In one example, sensor 26 may be re-positioned to provide sensor 27, which generates a second signal having a polarity opposite the polarity of the first signal generated by sensor 24. In such an example, when the polarities of the first signal and the second signals are opposite, processor 24 is able to determine conductor 16 is equally spaced between sensors 24 and 26 when the sum of the first and second signals is zero. Sensors 24 and 26 may be positioned and/or orientated in a number of manners in other embodiments to facilitate efficient determination of current by current device 18.

Figure 3:
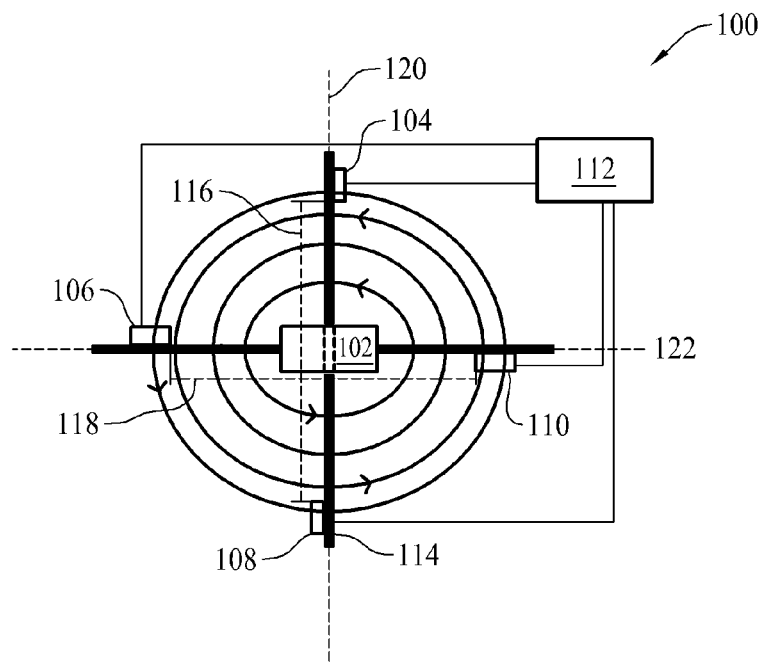
FIG. 3 is a block diagram of another exemplary current device, having four sensors.

FIG. 3 illustrates another exemplary embodiment of a current device 100. In the exemplary embodiment, current device 100 includes a conductor 102 surrounded by a first sensor 104, a second sensor 106, a third sensor 108, and a fourth sensor 110 (collectively, sensors 104-110), and a processor 112 coupled to each of sensors 104-110. Each of sensors 104-110 is disposed adjacent to and evenly distributed about conductor 102. In the exemplary embodiment, sensors 104-110 are supported by substrate 114. In other embodiments, one or more different configurations of substrate (e.g., size, shape, etc.) may be used to support one or more of sensors 104-110 at particular positions, relative to one another. In one or more examples, the configuration of substrate 114 may depend on, among other things, the number of sensors 104-110, an orientation of sensors 104-110, a proximity of sensors 104-110 to conductor 102, and/or the environment in which the current device 100 is intended to be installed.

Sensor 104 is spaced apart from sensor 108 by a first predetermined distance 116, and sensor 106 is spaced apart from sensor 110 by a second predetermined distance 118. As shown, sensors 104 and 108 are linearly disposed with conductor 102 along line 120. Sensors 106 and 110 are linearly disposed with conductor 102 along line 122. Each of sensors 104-110 is configured to measure a magnetic flux provided from conductor 102 and to generate a signal proportional to the magnetic flux. Based on the number of sensors 104-110 used in current device 100, processor 112 is able to detect and mitigate displacement of conductor 102 in the x-direction (aligned with line 122) and the y-direction (aligned with line 120). Specifically, in the exemplary embodiment, processor 112 employs principles of trigonometry (e.g., Pythagorean Theorem, etc.) to determine, from the first and second predetermined distances 116 and 118 and the signals from sensors 104-110, the distance of conductor 102 from one or more of sensors 104-110.

It should be appreciated that a variety of calculations may be performed based on one or more signals from sensors and/or predetermined distances and/or angles between such sensors to accurately measure current through a conductor using multiple sensors. Such calculation may further rely on restricting the potential displacement of conductor 16. For example, the friction fit between substrate 34 and conductor 16 inhibits relative displacement of conductor 16, except in the y-direction.

Figure 4:
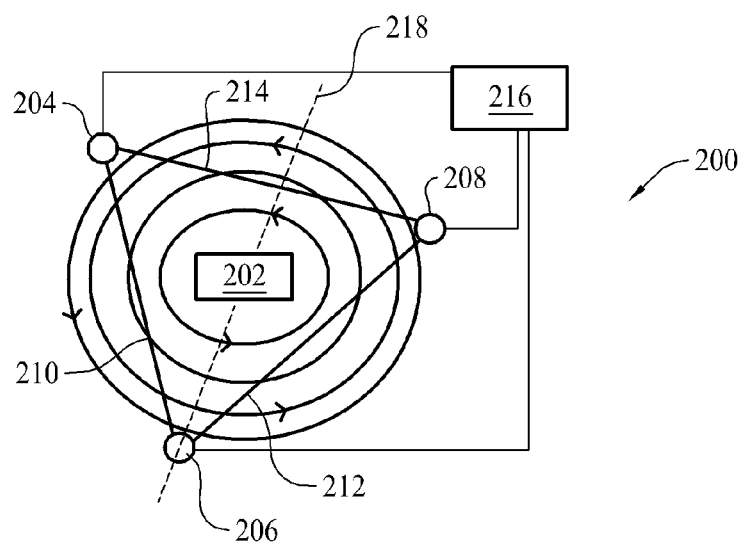
FIG. 4 is a block diagram of yet another exemplary current device, having three sensors.

FIG. 4 illustrates yet another exemplary current device 200. As shown, current device 200 includes a conductor 202 and a plurality of sensors 204, 206, and 208 (first sensor 204, second sensor 206, and third sensor 208, collectively, sensors 204-208) evenly distributed about conductor 202. Sensors 204 and 206 are spaced from one another by predetermined distance 210 and sensors 206 and 208 are spaced from one another by predetermined distance 212. Further, sensors 204 and 208 are spaced by predetermined distance 214. Further, as shown, sensor 206 and conductor 202 define a line 218. Sensors 204 and 208 are offset from line 218.

Each of sensors 204, 206 and 208 are coupled to a processor 216 to provide a signal proportional to the magnetic flux at the respective one of sensors 204-208. As such, similar to the description above, processor 216 may be configured to employ principles of trigonometry to determine the distance of conductor 202 from one or more of sensors 204-208. It should be appreciated that a different number of sensors may be included in other current device embodiments. For example, sensor 208 may be omitted from current device 200, when potential displacement of conductor 202 is limit to a single direction. The number/orientation of sensors may be selected based on, among other things, a desired accuracy of the current device, a cost associated with the sensors, and/or tendency/restriction of a conductor to be displaced, etc.

Figure 5:
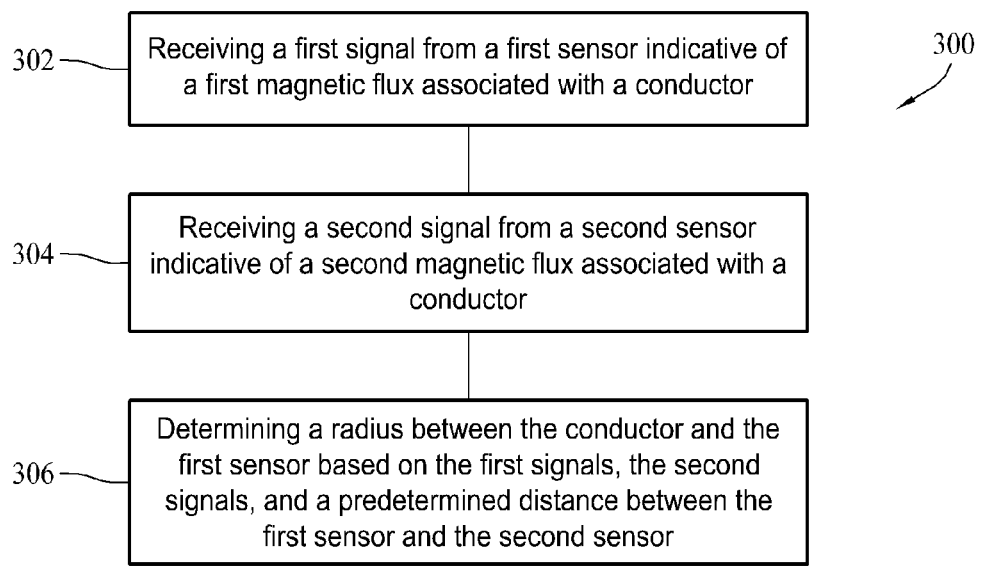
FIG. 5 is a block diagram of an exemplary method for use in measuring a current through a conductor using multiple sensors.

FIG. 5 illustrates an exemplary method 300 for use in measuring current through a conductor. Method 300 includes receiving 302 a first signal from a first sensor indicative of a first magnetic flux provided from a conductor, receiving 304 a second signal from a second sensor indicative of a second magnetic flux provided from the conductor, and determining 306 a radius between the conductor and the first sensor based on the first signals, the second signals, and a predetermined distance between the first sensor and the second sensor.

In at least one embodiment, method 300 includes periodically determining the radius between the conductor and the first sensor and storing the radius in memory associated with the processor. Additionally, method 300 may include recalling the radius from memory and determining a current through the conductor based on the recalled radius, the first signal, and the second signal.

The methods and systems described herein are not limited to the specific embodiments described herein. For example, components of each system and/or steps of each method may be used and/or practiced independently and separately from other components and/or steps described herein. In addition, each component and/or step may also be used and/or practiced with other systems and methods.

This written description uses examples to disclose the invention, including the best mode, and also to enable any person skilled in the art to practice the invention, including making and using any devices or systems and performing any incorporated methods. The patentable scope of the present disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A current device for use in measuring a current through a conductor, said current device comprising:
   a first sensor configured to measure a first magnetic flux associated with the conductor and to generate a first signal proportional to the first magnetic flux;
   a second sensor configured to measure a second magnetic flux associated with the conductor and to generate a second signal proportional to the second magnetic flux, said second sensor spaced from said first sensor by a first predetermined distance;
   a substrate to which said first sensor and said second sensor are coupled, said substrate configured to extend through an aperture defined by the conductor, the aperture disposed between said first sensor and said second sensor; and
   a processor coupled to said first sensor and to said second sensor, said processor configured to determine, based on the first signal, the second signal, and the first predetermined distance, a radius between the conductor and at least one of said first sensor and said second sensor.

2. The current device of claim 1, wherein said processor is configured to determine a current through the conductor based on the radius.

3. The current device of claim 2, wherein said processor is configured to determine the radius based on a ratio defined by the first signal and the second signal.

4. The current device of claim 2, wherein the first sensor comprises a Hall effect sensor, and wherein said second sensor comprises a Hall effect sensor.

5. The current device of claim 1, wherein said first sensor, said second sensor and said conductor are linearly disposed.

6. The current device of claim 1, wherein said second sensor and said conductor define a line, said first sensor offset from said line.

7. The current device of claim 1, further comprising:
   a third sensor configured to measure a third magnetic flux associated with the conductor and to generate a third signal proportional to the third magnetic flux; and
   a fourth sensor configured to measure a fourth magnetic flux associated with the conductor and to generate a fourth signal proportional to the fourth magnetic flux, wherein said processor is configured to determine, based on the third signal, the fourth signal and a second predetermined distance between said third sensor and said fourth sensor, the radius between the conductor and at least one of said first sensor and said second sensor, wherein the aperture is further disposed between said third sensor and said fourth sensor, and wherein said first sensor, said second sensor, said third sensor, and said fourth sensor are evenly distributed about the aperture and surround the aperture.

8. The current device of claim 1, further comprising a third sensor configured to measure a third magnetic flux associated with the conductor and to generate a third signal proportional to the third magnetic flux, said third sensor spaced from said first sensor by a second predetermined distance, said third sensor spaced from said second sensor by a third predetermined distance, wherein the aperture is further disposed between said first sensor, said second sensor, and said third sensor, wherein said first sensor, said second sensor, and said third sensor are evenly distributed about the aperture and surround the aperture, and wherein said processor is configured to determine, based on the third signal, the second predetermined distance, and the third predetermined distance, the radius between the conductor and at least one of said first sensor and said second sensor.

9. The current device of claim 1, wherein said first sensor and said second sensor are oriented on said substrate such that the polarity of the first signal is opposite the polarity of the second signal.

10. A method for use in measuring a current through a conductor, said method comprising:
    measuring a first magnetic flux generated by the conductor using a first sensor coupled to a substrate and disposed in a first position with respect to the conductor;
    receiving, at a processor, a first signal from the first sensor indicative of the first magnetic flux;
    measuring a second magnetic flux generated by the conductor using a second sensor coupled to the substrate and disposed in a second position opposite the first position with respect to the conductor, wherein the conductor defines an aperture through which the substrate extends;
    receiving, at the processor, a second signal from the second sensor indicative of the second magnetic flux; and
    determining a radius between the conductor and the first sensor based on the first signal, the second signal, and a predetermined distance between the first sensor and the second sensor.

11. The method of claim 10, wherein determining the radius between the conductor and the first sensor includes periodically determining the radius between the conductor and the first sensor and storing the radius in memory associated with the processor.

12. The method of claim 11, further comprising recalling the radius from memory and determining a current through the conductor based on the recalled radius, the first signal, and the second signal.

13. A current device for use in measuring a current through a conductor, said current device comprising:
    a first sensor coupled to a substrate and configured to measure a first magnetic flux associated with the conductor and to generate a first signal proportional to the first magnetic flux, the conductor defining an aperture through which the substrate extends;
    a second sensor coupled to the substrate and configured to measure a second magnetic flux associated with the conductor and to generate a second signal proportional to the second magnetic flux, said second sensor spaced from said first sensor by a first predetermined distance, wherein said first sensor is disposed opposite said second sensor with respect to the conductor and the aperture; and
    a processor coupled to said first sensor and to said second sensor, said processor configured to determine, based on the first signal, the second signal, and the first predetermined distance, a radius between the conductor and at least one of said first sensor and said second sensor.

* * * * *